(12) United States Patent
Craft, Jr. et al.

(10) Patent No.: US 10,492,341 B2
(45) Date of Patent: Nov. 26, 2019

(54) MODULAR DATA CENTER

(71) Applicant: CommScope Technologies LLC, Hickory, NC (US)

(72) Inventors: Thomas F. Craft, Jr., Murphy, TX (US); Alan James Skrepcinski, Plano, TX (US); Patrick Eugene Yantz, San Rafael, CA (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/642,937

(22) Filed: Jul. 6, 2017

(65) Prior Publication Data

US 2018/0014434 A1 Jan. 11, 2018

Related U.S. Application Data

(60) Provisional application No. 62/359,536, filed on Jul. 7, 2016.

(51) Int. Cl.
*H05K 7/20* (2006.01)
*H05K 7/14* (2006.01)

(52) U.S. Cl.
CPC ....... *H05K 7/20781* (2013.01); *H05K 7/1497* (2013.01); *H05K 7/2079* (2013.01); *H05K 7/20136* (2013.01); *H05K 7/20263* (2013.01); *H05K 7/20272* (2013.01); *H05K 7/20736* (2013.01); *H05K 7/20745* (2013.01); *H05K 7/20836* (2013.01)

(58) Field of Classification Search
CPC ....... G06F 1/181–182; H05K 7/20218–20381; H05K 7/20409–20418; H05K 7/20009–202; H05K 7/20818; H05K 7/1497; H05K 7/20736; H05K 7/2079; H05K 7/20836; H01L 23/367–3677; H01L 23/473; H01L 23/46–467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 9,179,574 B2 * | 11/2015 | Canney | ............... | H05K 7/1497 |
| 2004/0100770 A1 * | 5/2004 | Chu | ................... | H05K 7/20754 361/698 |
| 2004/0264124 A1 * | 12/2004 | Patel | ........................ | G06F 1/20 361/679.46 |
| 2005/0254214 A1 * | 11/2005 | Salmon | ................. | H01L 23/473 361/699 |
| 2008/0204999 A1 * | 8/2008 | Clidaras | ............ | H05K 7/20745 361/696 |

(Continued)

*Primary Examiner* — Robert J Hoffberg
*Assistant Examiner* — Razmeen Gafur
(74) *Attorney, Agent, or Firm* — Merchant & Gould P.C.

(57) ABSTRACT

The present disclosure is directed to examples of modular data centers configured to provide cooling to liquid-cooled electronics equipment stored within the modular data centers. In one aspect, a modular data center can be configured to provide cooling without requiring the use of mechanical refrigeration (e.g. vapor-compression or absorption refrigeration), through the use of a dry cooler in combination with an optional evaporative cooler.

5 Claims, 16 Drawing Sheets

(56) References Cited

U.S. PATENT DOCUMENTS

| | | | |
|---|---|---|---|
| 2008/0209931 A1* | 9/2008 | Stevens | F28D 15/0275 361/699 |
| 2008/0266794 A1* | 10/2008 | Malone | H05K 7/20745 361/695 |
| 2009/0262495 A1* | 10/2009 | Neudorfer | G06F 1/20 361/679.47 |
| 2009/0262501 A1* | 10/2009 | Claassen | G06F 1/20 361/701 |
| 2011/0026225 A1* | 2/2011 | Ostwald | H05K 7/20645 361/699 |
| 2011/0134604 A1* | 6/2011 | Attlesey | G06F 1/20 361/679.47 |
| 2011/0317367 A1* | 12/2011 | Campbell | H05K 7/203 361/700 |
| 2012/0033377 A1* | 2/2012 | Salpeter | H05K 7/1488 361/679.53 |
| 2012/0129442 A1* | 5/2012 | Wei | H05K 7/1497 454/184 |
| 2012/0218711 A1* | 8/2012 | Kashirajima | F25B 25/00 361/700 |
| 2012/0297807 A1* | 11/2012 | Canney | H05K 7/1497 62/228.4 |
| 2013/0077238 A1* | 3/2013 | Babish | H01L 23/473 361/689 |
| 2013/0269385 A1* | 10/2013 | Takahashi | H05K 7/20745 62/513 |
| 2014/0029193 A1* | 1/2014 | Alshinnawi | G06F 1/20 361/679.47 |
| 2014/0063730 A1* | 3/2014 | Hay | G06F 1/20 361/679.46 |
| 2014/0071623 A1* | 3/2014 | Suzuki | H05K 7/20636 361/699 |
| 2014/0078668 A1* | 3/2014 | Goulden | H05K 7/20736 361/679.47 |
| 2014/0085808 A1* | 3/2014 | Tung | H05K 7/20736 361/679.47 |
| 2014/0313669 A1* | 10/2014 | Babish | H01L 23/473 361/699 |
| 2014/0362520 A1* | 12/2014 | Alshinnawi | H05K 7/20781 361/679.47 |
| 2014/0376176 A1* | 12/2014 | Franz | H05K 7/20772 361/679.47 |
| 2015/0003009 A1* | 1/2015 | Moore | H05K 7/20781 361/679.47 |
| 2015/0049432 A1* | 2/2015 | Best | H05K 7/20763 361/679.53 |
| 2015/0173252 A1* | 6/2015 | Zeighami | H05K 7/20781 340/606 |
| 2015/0351290 A1* | 12/2015 | Shedd | F25B 23/006 361/679.47 |
| 2016/0088764 A1* | 3/2016 | David | F04D 25/166 361/679.48 |
| 2017/0347499 A1* | 11/2017 | Ross | H05K 7/20745 |
| 2018/0209666 A1* | 7/2018 | Lord | F24D 19/00 |

* cited by examiner

MODULAR DATA CENTER

RELATED APPLICATIONS

This application claims priority to United States provisional patent application Ser. No. 62/359,536 filed on Jul. 7, 2016, the entirety of which is incorporated by reference herein.

TECHNICAL FIELD

The present disclosure relates to data centers constructed from multiple modules, and particularly to modular data centers that provide cooling to liquid-cooled electronics equipment.

BACKGROUND

Electronics equipment stored in data centers requires cooling. Much of today's standard equipment is cooled by passing air in and/or around the equipment, which is typically stored in racks. As advancements have occurred, the arrangement density of the equipment has been limited by the ability to provide enough air to cool the equipment. To overcome this limitation, developments in technology for liquid cooled electronics equipment have been underway for the past decade or more. As liquid cooled equipment has become more commonplace, systems have been developed to provide cooling to such systems. A typical approach has been to provide cooling from mechanical equipment, such as a direct expansion (DX) refrigeration system, to the electronics equipment via a liquid refrigerant.

SUMMARY

A modular data center is presented herein. In one aspect, the data center is comprised of multiple modules that define an enclosure which in turn defines a first interior space and a second interior space. The first interior space can house air or liquid cooled electronics equipment while the second interior space defines an air plenum having an air inlet and an air outlet. A heat exchanger is located in the second interior space and between the air inlet and the air outlet. The heat exchanger is an air-to-liquid heat exchanger having an air side and a liquid side. Optionally, an evaporative cooler can be provided and located between the air inlet and the air side of the first heat exchanger. The evaporative cooler utilizes a water source to cool and humidify air travelling across the evaporative cooler and entering the air side of the heat exchanger. A fan can also be provided that is located within the second interior space that. When activated, the fan draws air into the air inlet, through the evaporative cooler and the air side of the heat exchanger, and out of the air outlet.

A cooling circuit can also be provided that includes a supply line and a return line connecting the liquid side of the first heat exchanger to the liquid cooled electronics equipment. The cooling circuit includes a pump that, when activated, circulates a refrigerant between the first heat exchanger liquid side and the liquid cooled electronics equipment via the supply and return lines. In one example, the cooling circuit includes one or more control valves in the supply or return line to control refrigerant flow to individual or grouped units of the liquid cooled electronics equipment.

The modular data center can also include an electronic control system that controls operation of the fan, the pump, and the one or more valves. The control system can be configured to control the speed of at least one of the fan and pump to maintain a liquid temperature setpoint in the return line of the cooling circuit. The control system can also be configured to control the speed of the pump to maintain a pressure setpoint in the supply line of the cooling circuit at a location between the one or more control valves and the pump.

Additional objects and advantages will be set forth in part in the description which follows, and in part will be obvious from the description, or may be learned by practice of the teachings presented herein. The objects and advantages will also be realized and attained by means of the elements and combinations particularly pointed out in the appended claims. It is to be understood that both the foregoing general description and the following detailed description are exemplary and explanatory only and are not restrictive of the claimed invention.

DESCRIPTION OF THE DRAWINGS

Non-limiting and non-exhaustive embodiments are described with reference to the following figures, which are not necessarily drawn to scale, wherein like reference numerals refer to like parts throughout the various views unless otherwise specified.

DETAILED DESCRIPTION

Figure 1:
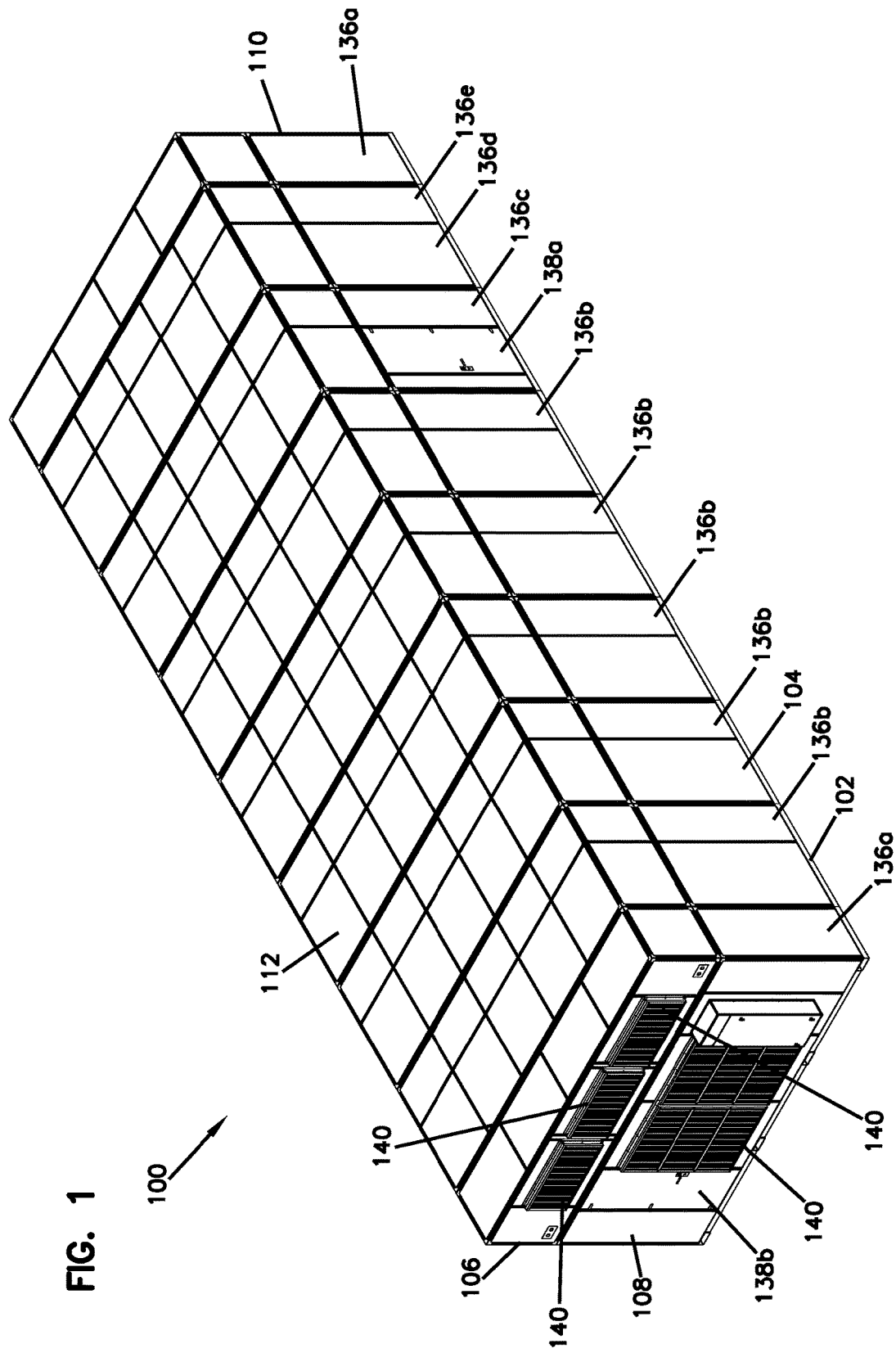
FIG. 1 is a perspective view of a first example of a modular data center having features that are examples of aspects in accordance with the principles of the present disclosure.
Figure 2:
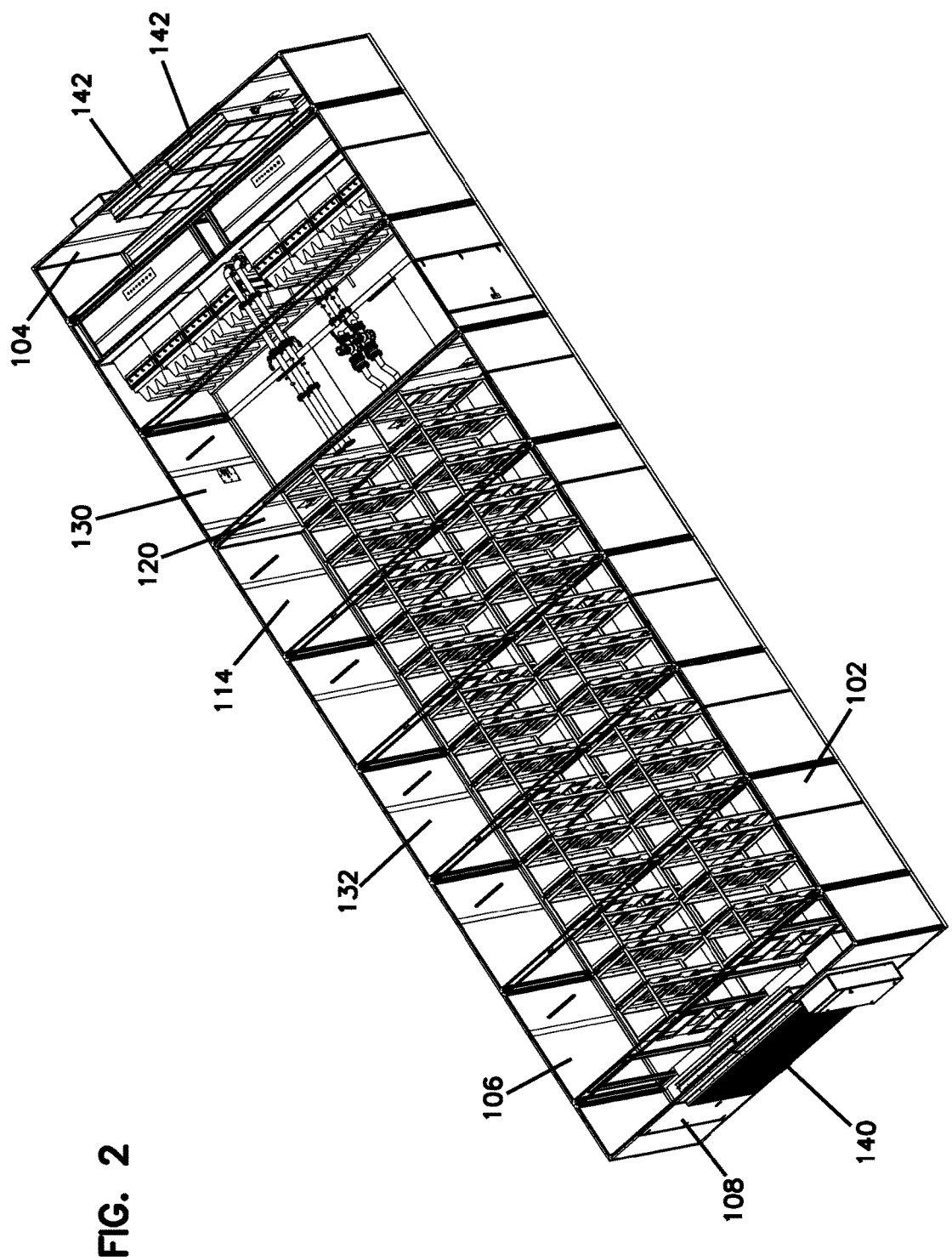
FIG. 2 is a perspective view of the modular data center shown in FIG. 1, with a roof portion removed to allow the interior of the modular data center to be viewed.
Figure 3:
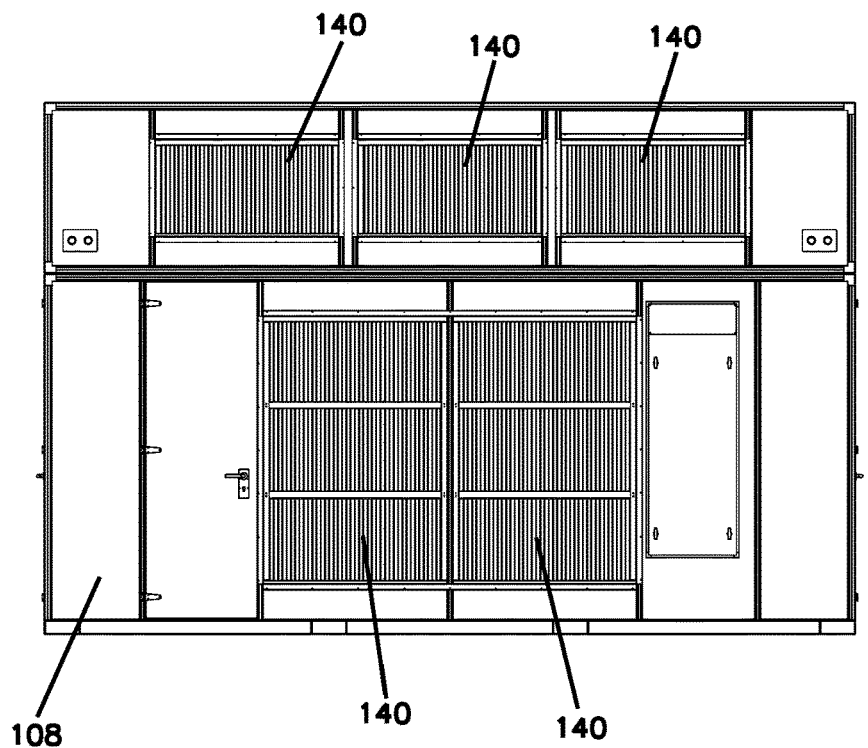
FIG. 3 is a first end view of the modular data center shown in FIG. 1.
Figure 4:
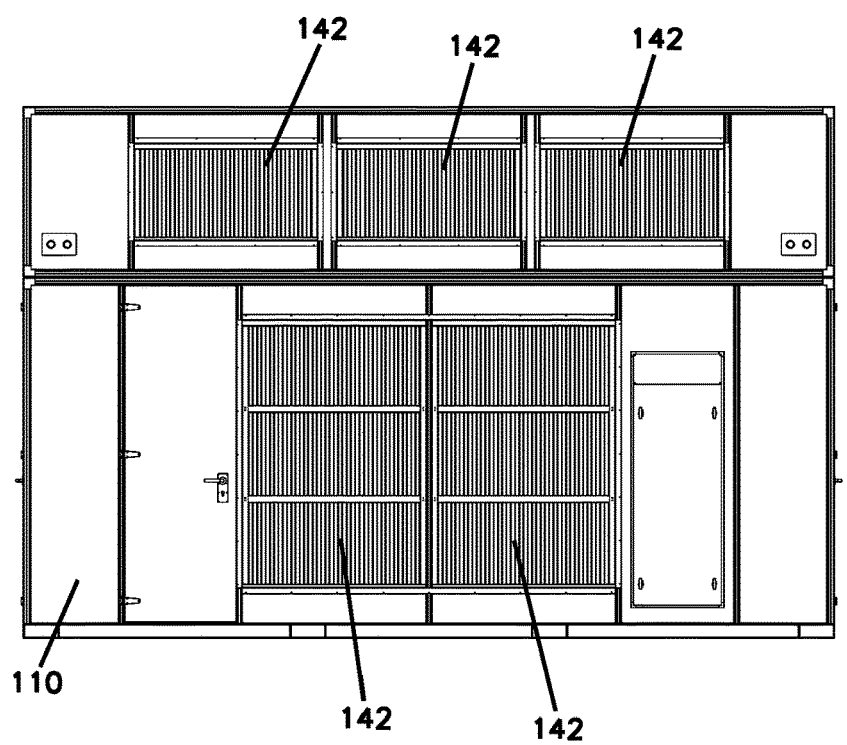
FIG. 4 is a second end view of the modular data center shown in FIG. 1.
Figure 5:
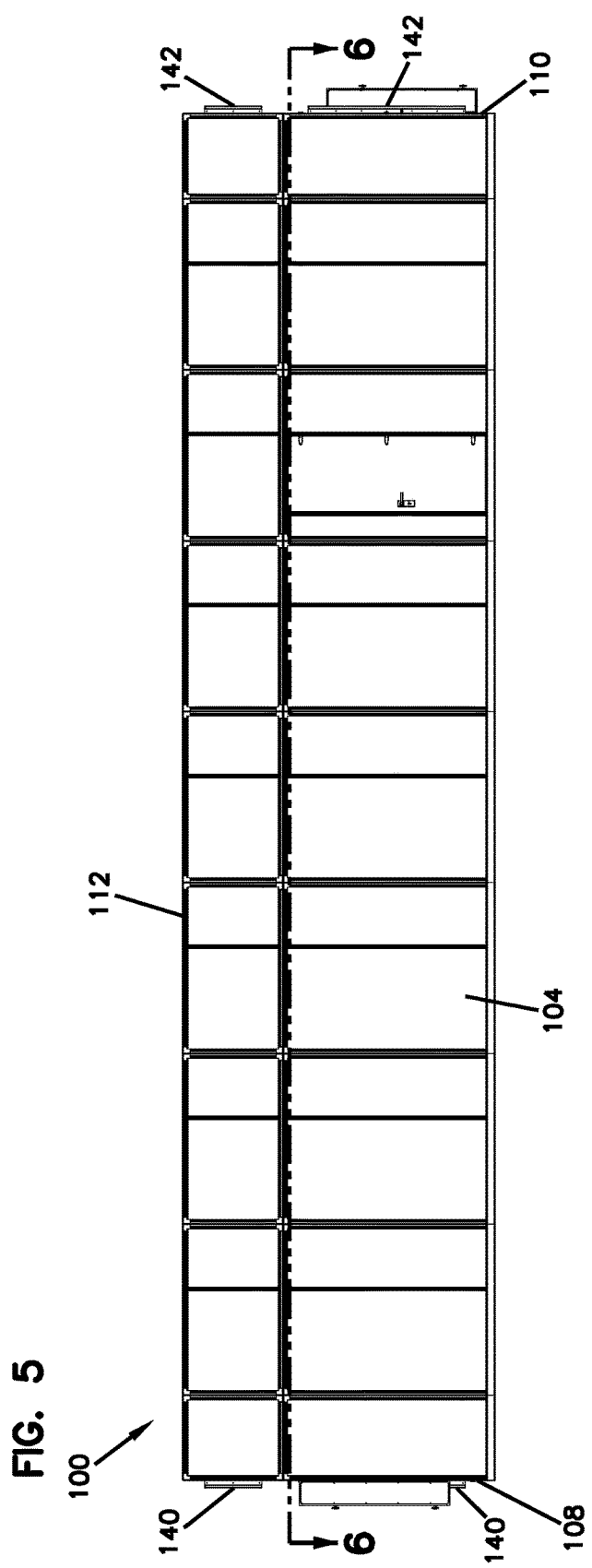
FIG. 5 is a side view of the modular data center shown in FIG. 1.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

A modular data center 100 is presented. In one aspect, the modular data center 100 includes a floor section 102 from which exterior side walls 104, 106 and end walls 108, and 110 extend up to a roof section 112 to form an enclosed space 114. The modular data center also includes interior walls 120, 122, 124, 126 that divide up the enclosed space 114 into a first interior space 130 and a second interior space 132. Additional support structures can also be provided to provide for modularity of the system.

In the example shown, the first interior space 130 is configured as an airflow plenum 130 having air inlets 140 located at end wall 108 and air outlets 142 located at end wall 110. The second interior space 132 is shown as being configured as a server or equipment room 132 housing multiple server racks 10 which hold liquid and/or air cooled equipment 12.

Figure 6:
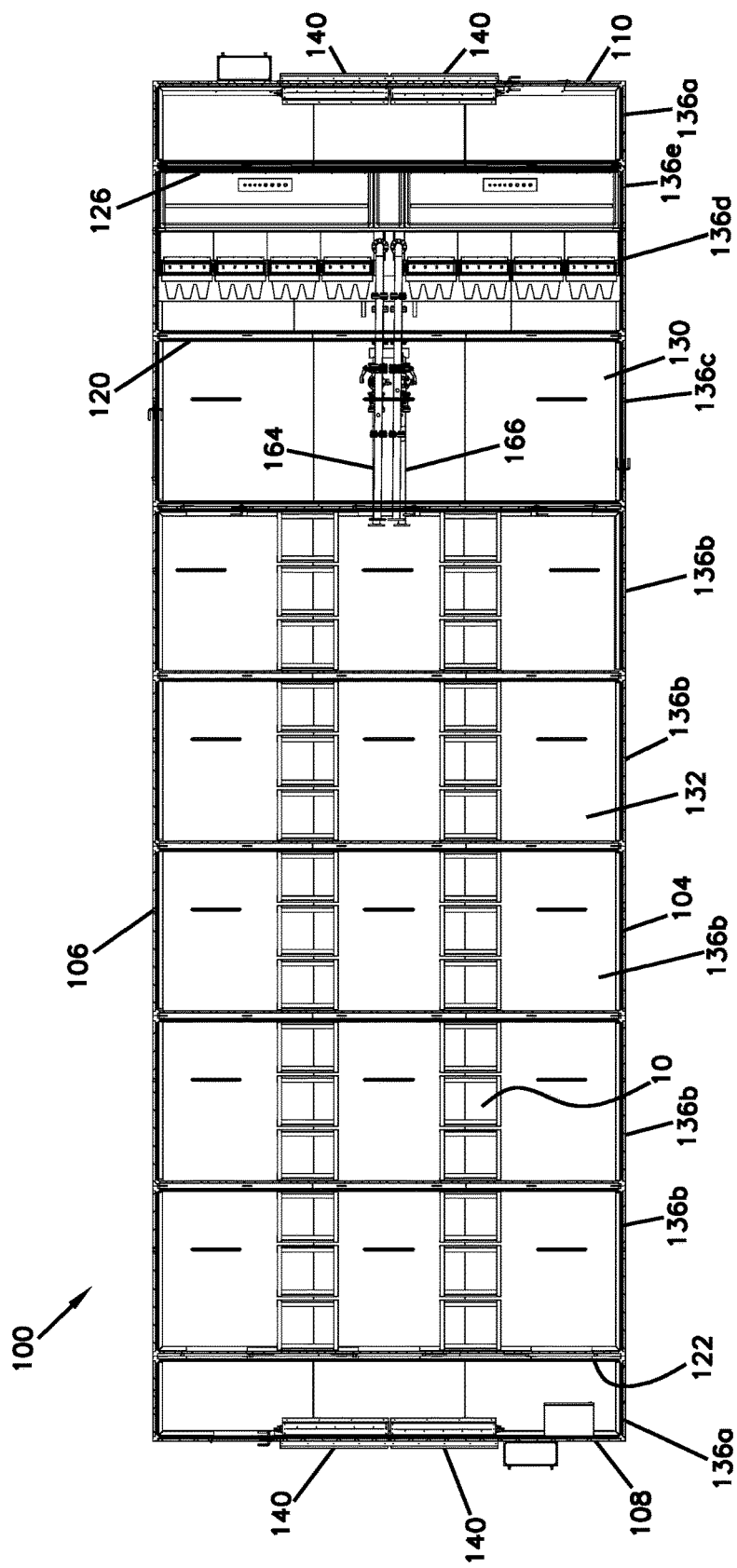
FIG. 6 is a top cross-sectional view of the modular data center shown in FIG. 1, taken along the line 6-6 in FIG. 5.
Figure 7:
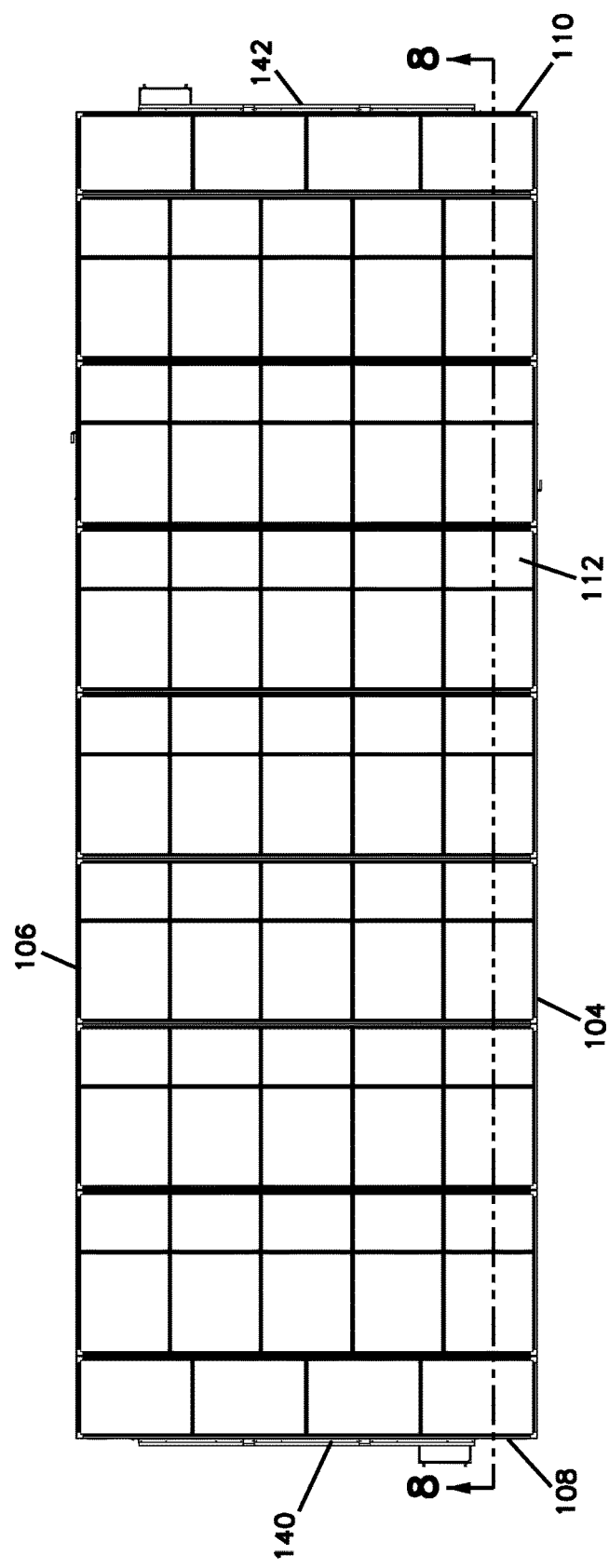
FIG. 7 is a top view of the modular data center shown in FIG. 1.
Figure 8:
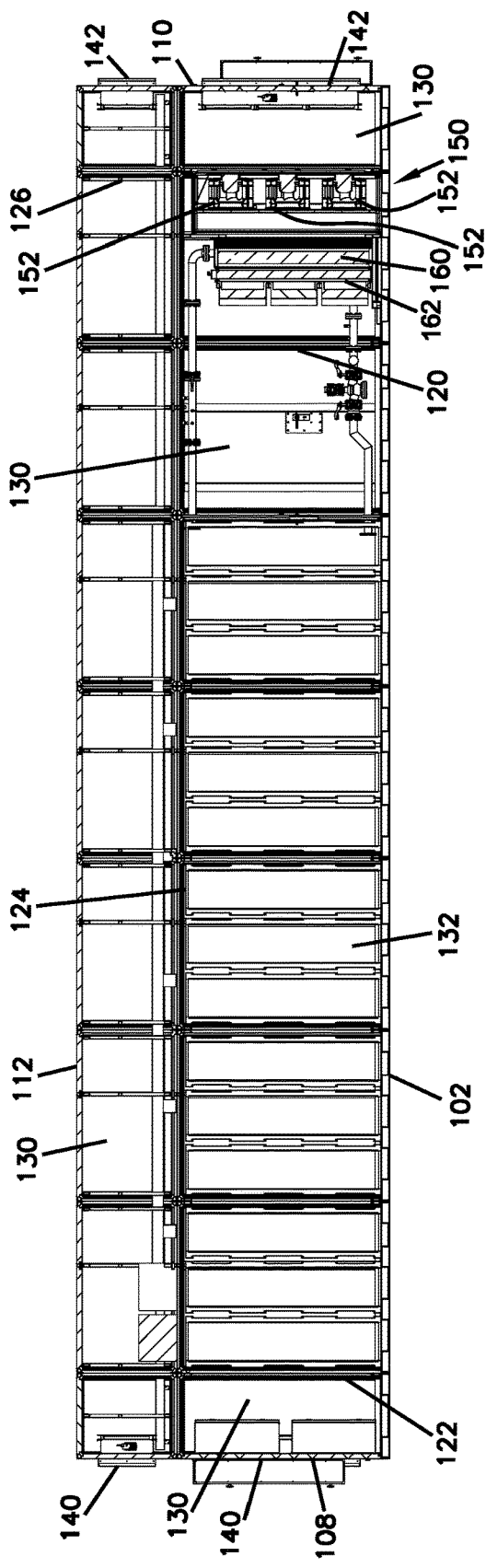
FIG. 8 is a side cross-sectional view of the modular data center shown in FIG. 1, taken along the line 8-8 in FIG. 7.
Figure 9:
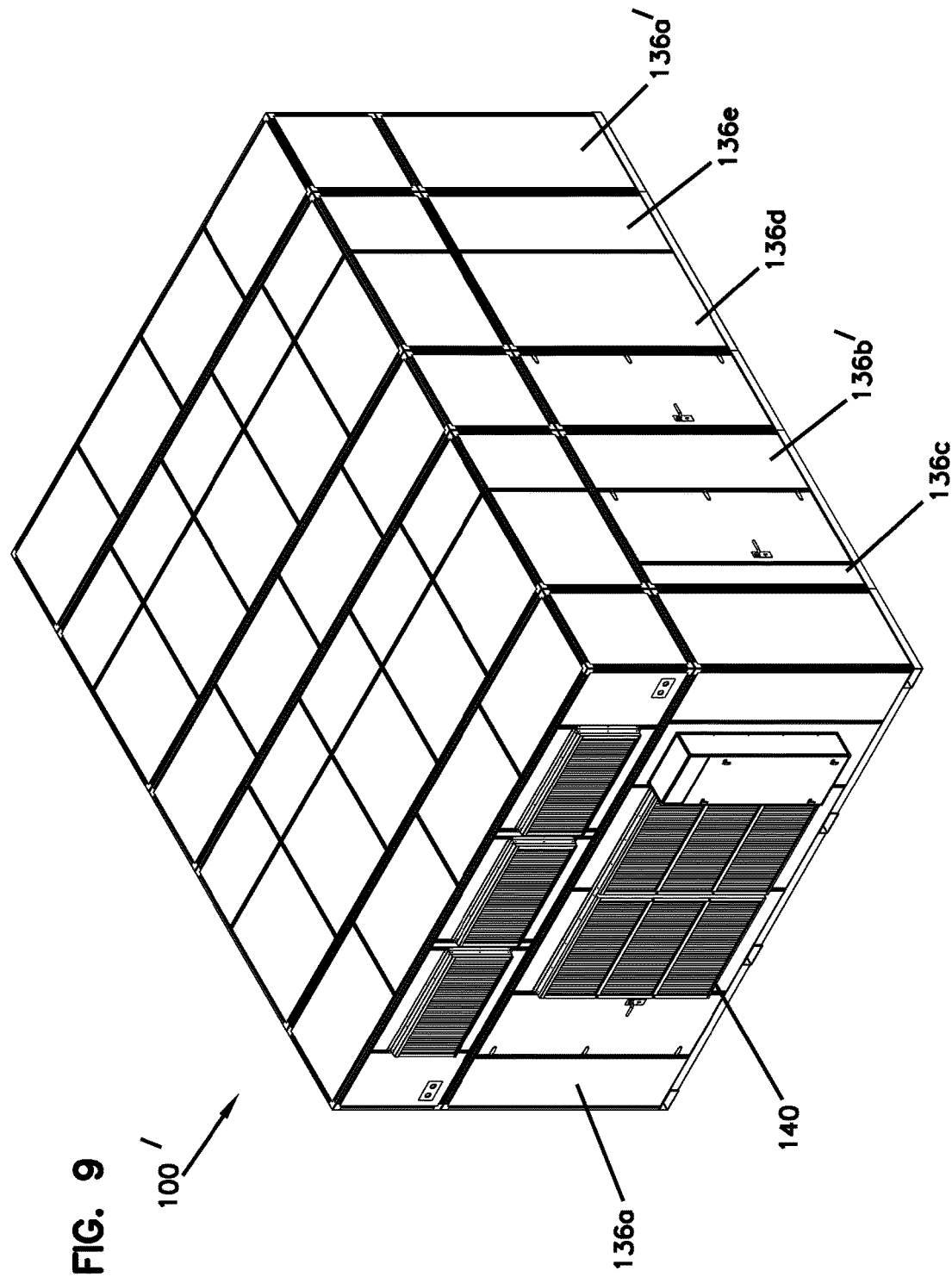
FIG. 9 is a perspective view of a second example of a modular data center having features that are examples of aspects in accordance with the principles of the present disclosure.
Figure 10:
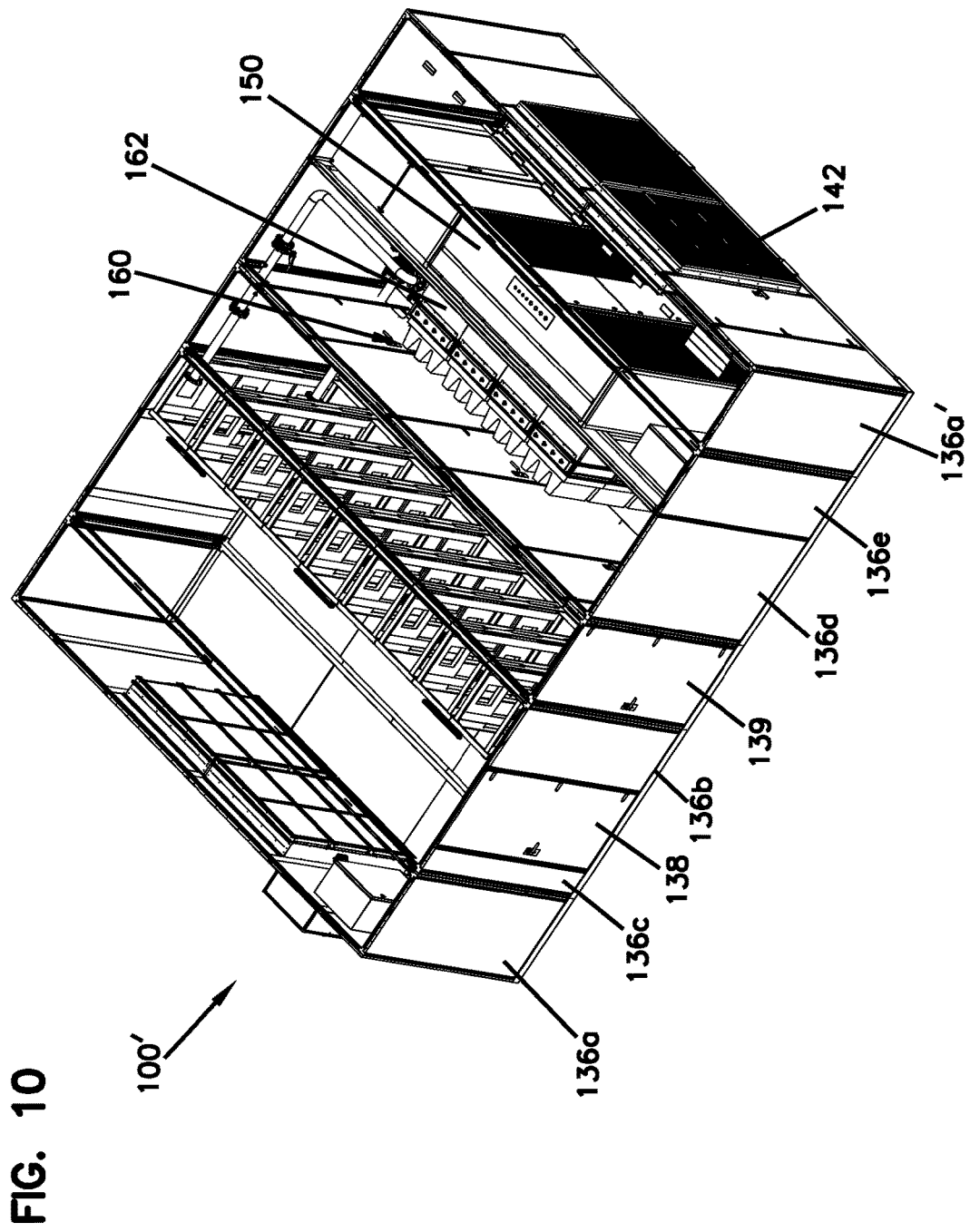
FIG. 10 is a perspective view of the modular data center shown in FIG. 9, with a roof portion removed to allow the interior of the modular data center to be viewed.
Figure 11:
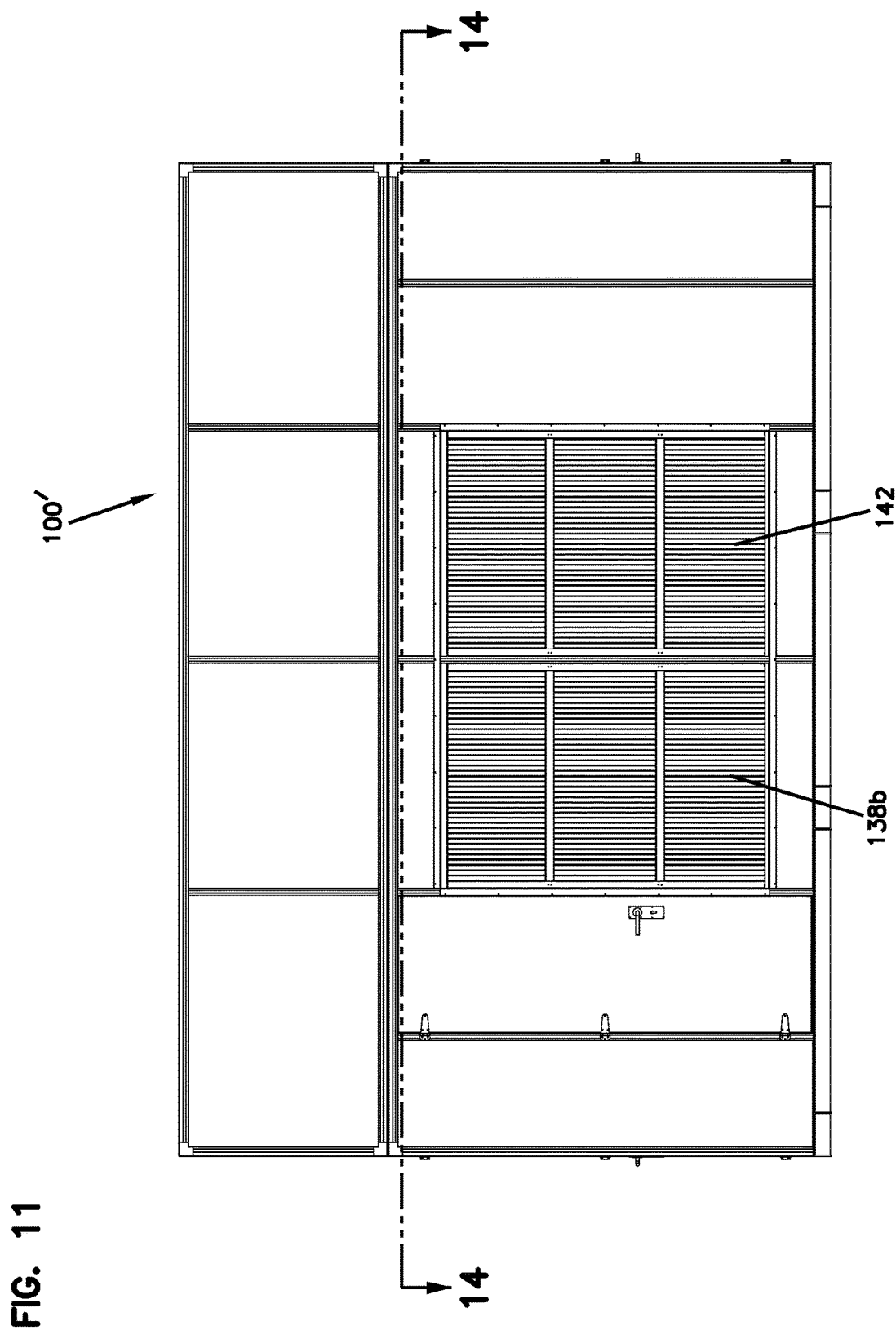
FIG. 11 is a first end view of the modular data center shown in FIG. 9.
Figure 12:
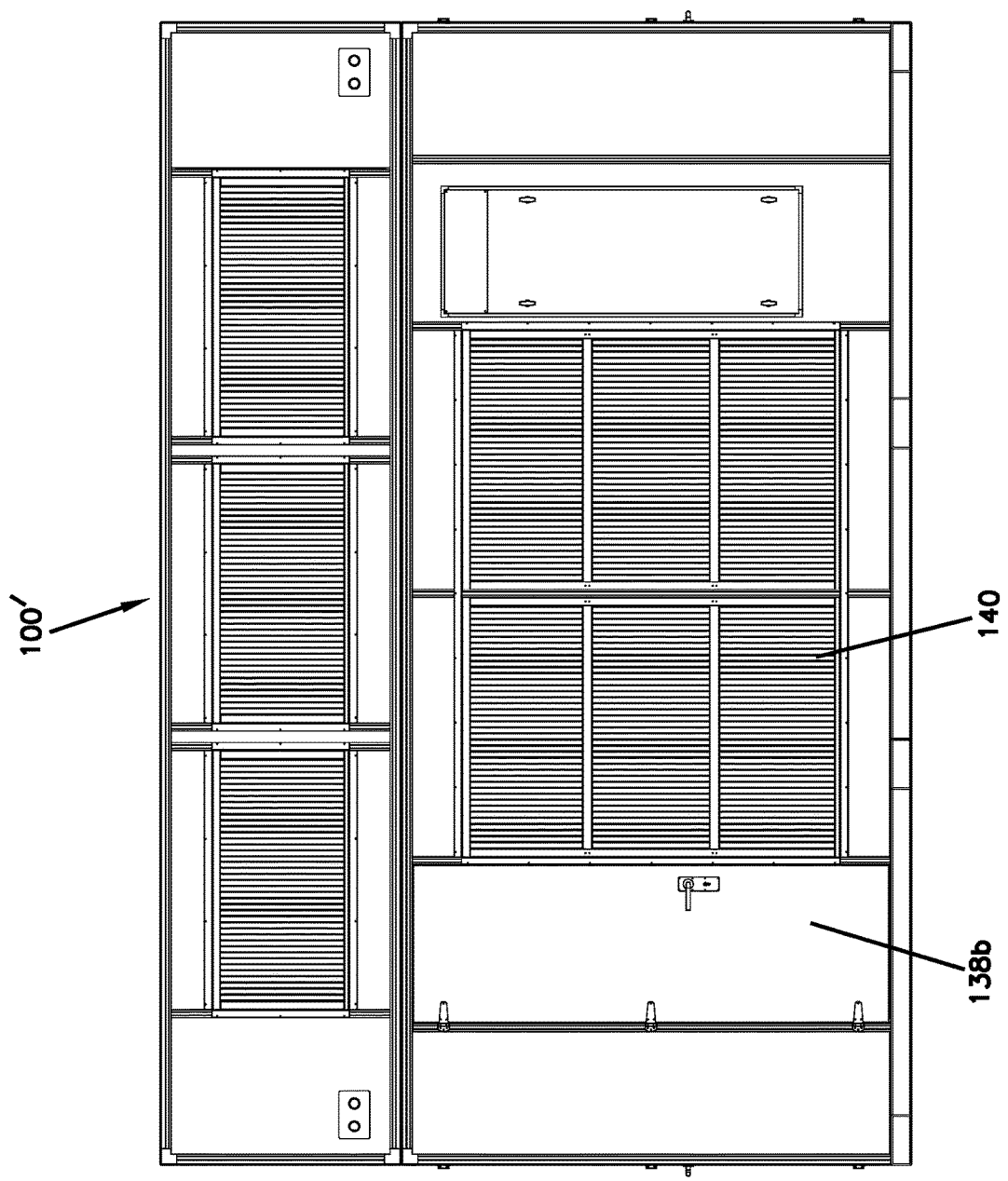
FIG. 12 is a second end view of the modular data center shown in FIG. 9.
Figure 13:
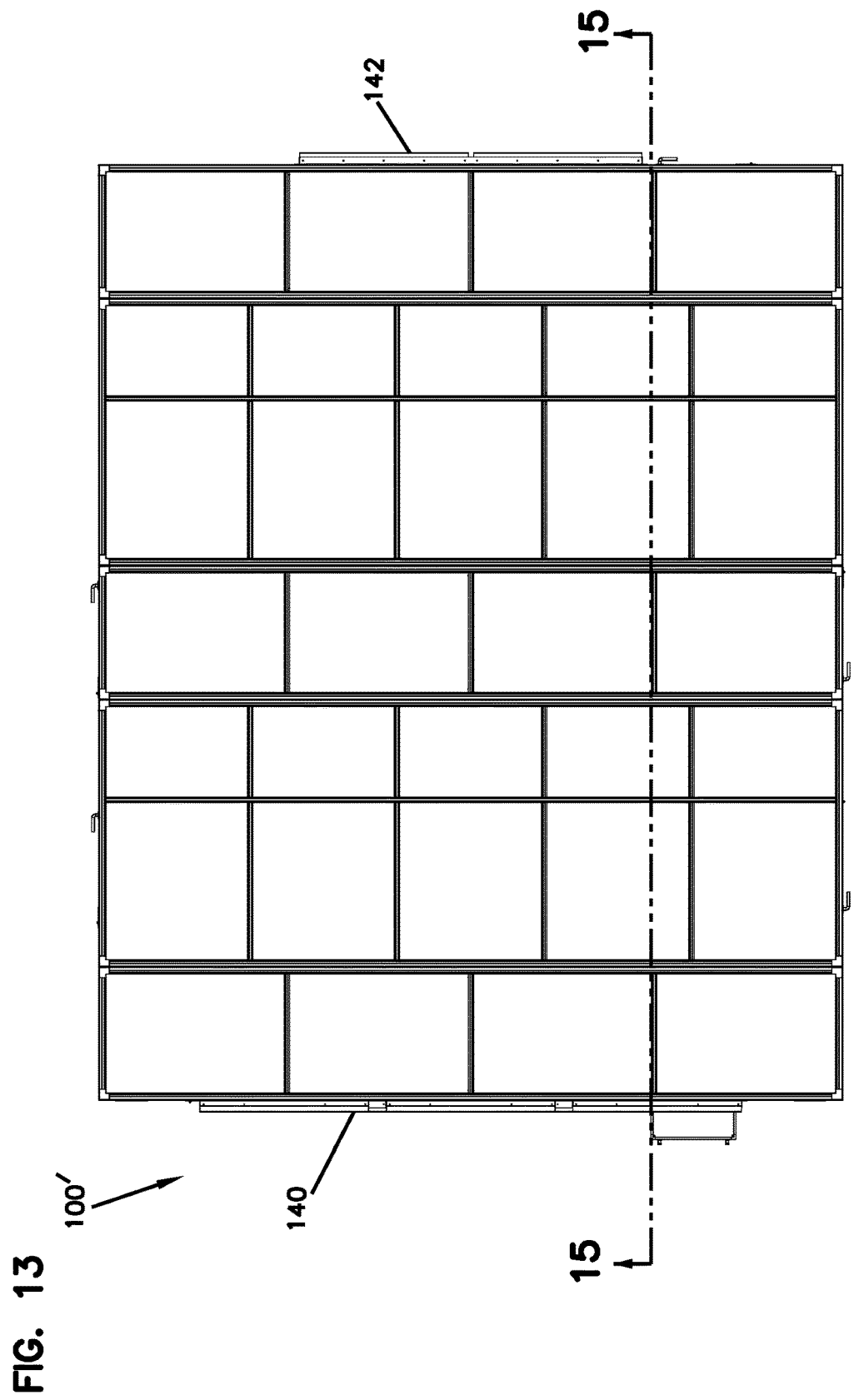
FIG. 13 is a top view of the modular data center shown in FIG. 9.
Figure 14:
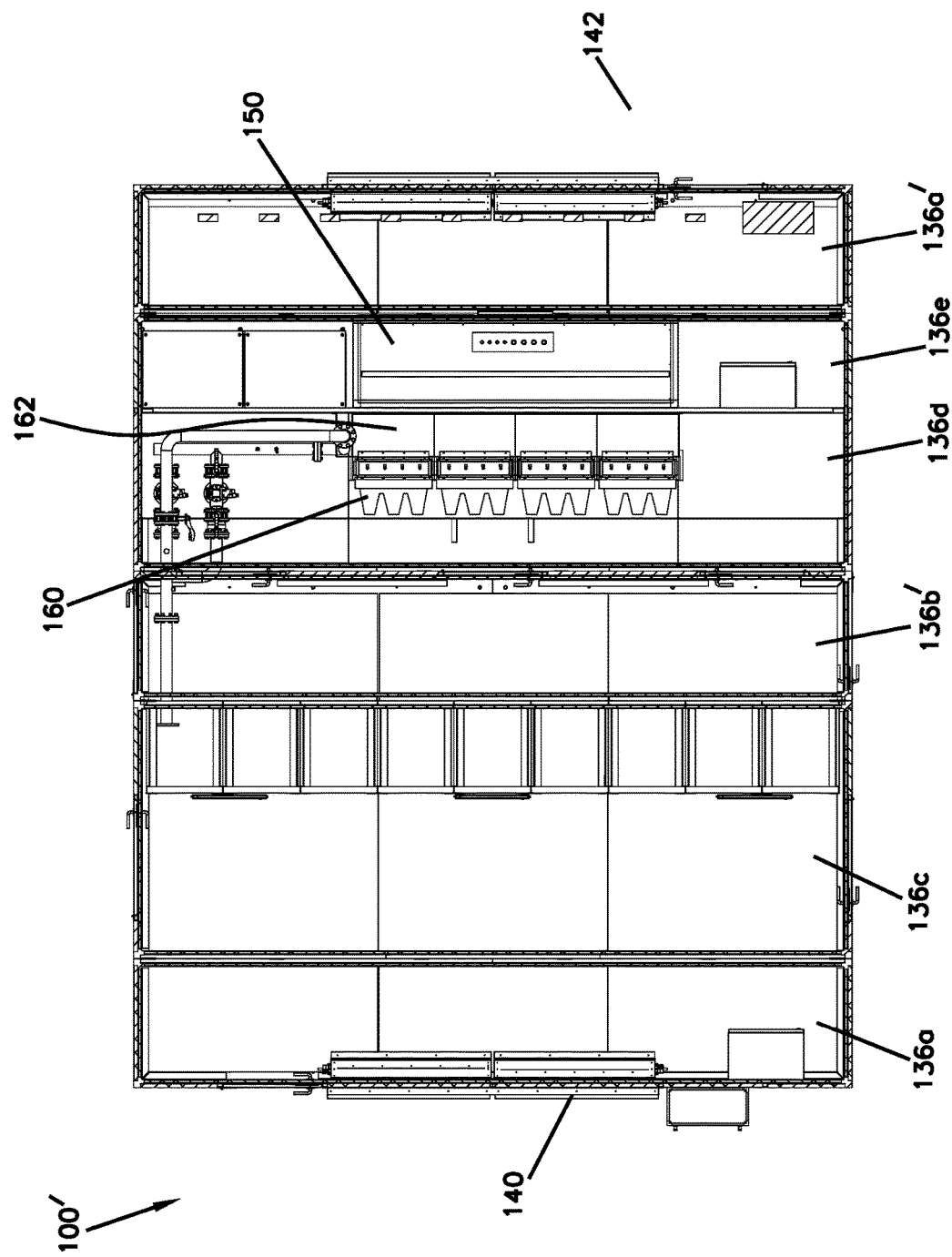
FIG. 14 is a top cross-sectional view of the modular data center shown in FIG. 9, taken along the line 14-14 in FIG. 11.
Figure 15:
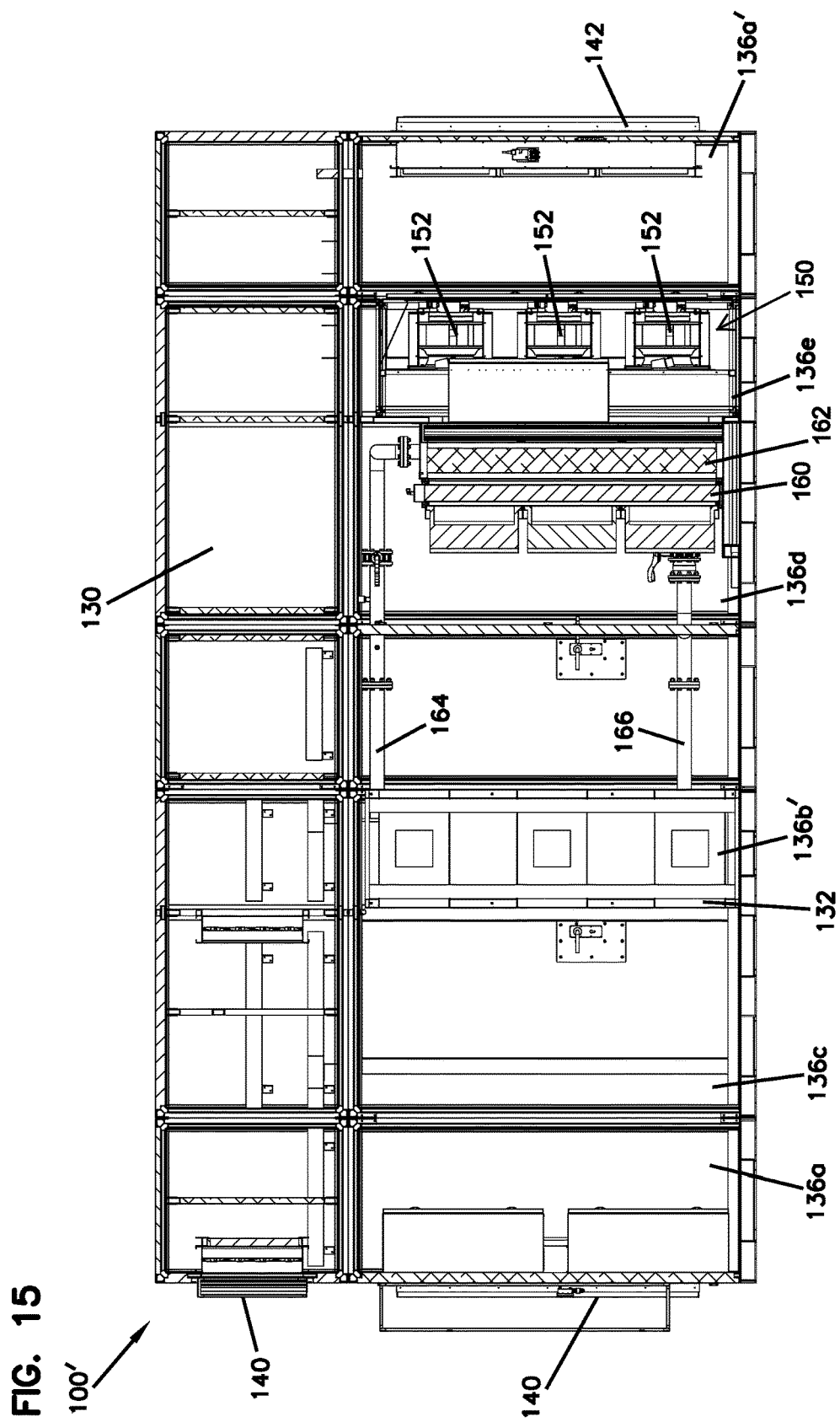
FIG. 15 is a side cross-sectional view of the modular data center shown in FIG. 9, taken along the line 15-15 in FIG. 13.

As most easily seen at FIGS. 1, 6, and 7, the modular data center 100 is constructed from multiple modules 136. Through the use of modules, multiple configurations having different storage and cooling capacities can be created in a customized fashion without requiring specialized construction.

An air inlet/outlet module 136a is provided at each end of the modular data center 100. In the example presented, the modules 136a are identical which can result in cost savings by eliminating the need to design and construct two different modules. However, differently designed modules can be provided, if desired. The air inlet/outlet modules 136a include the air inlets/outlets 140, 142 and also can be provided with an access door 138b. In one example, the air inlet module 136a is additionally provided with filters for removing contaminants from the incoming air stream.

A plurality of data modules 136b are also provided and are connected to each other and to the intake module 136a. The data modules 136b house the server racks 10 and equipment 12. Each of the data modules 136b is configured to hold a plurality of racks 10, and in the example shown six racks 10. In the example configuration presented, five data modules 136b are provided, thereby resulting in the provision of 30 racks 10. It is noted that the modular concept presented herein allows for any number of desired data modules 136b to be provided. Each of the data modules 136b is also constructed with a portion of the ceiling wall 124 such that the first and second interior spaces 130, 132 are defined by each individual module 136b. Once assembled, the wall 124 and roof structure 112 define a plenum 130 through which air from the intake module 136a can flow above the data center space 132.

The modular data center 100 is also shown as being provided with an access module 136c, a cooling module 136d, and a fan module 136e. The access module 136c is shown as including a doorway 138a for allowing a person to enter the interior space 132 to access the server racks and equipment 10, 12. The access module is attached to the endmost data module 136b opposite the air intake module 136a.

The cooling module 136d is shown as housing an evaporative cooler 160 and a dry cooler 162 downstream of the evaporative cooler and is in fluid communication with the first interior space 130. Accordingly, air drawn into the air intake module 136a and through the plenum space within the data modules 136b is delivered to the cooling module 136d where the air is first passed through the evaporative cooler 160 and then the dry cooler 162. In a broader sense, the evaporative cooler 160 may be referred to as a first heat exchanger 160 while the dry cooler 162 may be referred to as a second heat exchanger 162 or an air-to-liquid heat exchanger with an air side and a liquid side. It is noted that, in some applications, the evaporative cooler 160 may be removed such that all cooling is performed by the dry cooler 162.

In one aspect, the evaporative cooler 160 is a direct evaporative cooler in which water is dispersed onto a media through which the air flows. A control valve 161 (see FIG. 16) may be provided to control the amount of water dispersed. The effect of this operation is that the latent heat of evaporation of the water is used to cool and humidify the relatively warm air entering the evaporative cooler 160 while the liquid water is converted to water vapor. This cooler air is then introduced into the air side of the dry cooler 162. A liquid cooling circuit is in fluid communication with the liquid side of the dry cooler 162 via a supply line 164 and a return line 166. Accordingly, the cooled air entering the dry cooler 162 performs a heat exchange with the liquid refrigerant entering the dry cooler from the cooling circuit. In some examples, the liquid refrigerant is water, glycol, or a combination of water and glycol. As mentioned above, where the ambient air temperature is sufficient to cool the liquid refrigerant to a temperature suitable for cooling the equipment 12, the evaporative cooler does not need to be provided or can be deactivated when conditions permit.

To circulate the liquid refrigerant between the equipment 12 and the dry cooler 162, a pump 170 can be provided. The pump 170 is shown schematically at FIG. 16. The liquid cooling circuit can also include control valves 168, shown schematically at FIG. 16, for controlling an amount of fluid delivered to each rack 10 or piece of equipment 12 such that the fluid is delivered to the equipment on an as-needed basis. The control valves 168 can either be two-position or modulating and can be controlled through a variety of means, for example a return water temperature from the rack or equipment 10, 12. Where such valves are provided, the speed of the pump 170 can be controlled to maintain a pressure setpoint in the system.

The fan module 136e is shown as being connected between the cooling module 136d and the air outlet module 136b. The fan module 136e moves air between the inlets 140 and the outlets 142 via a fan system 150 which includes a plurality of individual fans 152 arranged in an array. In the embodiment presented, "N+1" individual fans 152 are provided, wherein N is the number of fans required to meet a required airflow for the system and wherein +1 represents an additional fan for redundancy purposes. However, more or fewer fans may be furnished, including a single fan. The fans may be provided with variable frequency drives such that the speed of the fans can be controlled to draw a desired amount of air through the heat exchangers 160, 162. Additionally, the fans can be staged on and off individually to meet airflow demands.

Referring to FIGS. 9-15, a second example of a modular data center 100' is presented. The modular data center 100' is similar in many respects to the data center 100, and similar reference numbers will therefore be used. The modular data center 100' is different in that it is configured as a smaller unit with only one data module 136b that is provided with 9 racks oriented in a transverse arrangement. Due to this arrangement, an access door 138b is provided in the data module 136b. The same air intake module 136a is utilized for the data center 100'. The access module 136c is also generally the same, but is instead connected between the air intake module 136a and the data module 136b. Due to the smaller cooling load, the cooling module is provided with smaller sized heat exchangers 160, 162, as compared to the data center 100. Similarly, fewer fans 152 are provided in the fan system 150 in the fan module 136e. The modular data center 100' is provided with an air outlet module 136b' that is different from that shown for the data center 100 in that the upper air outlets 142 are not provided.

Figure 16:
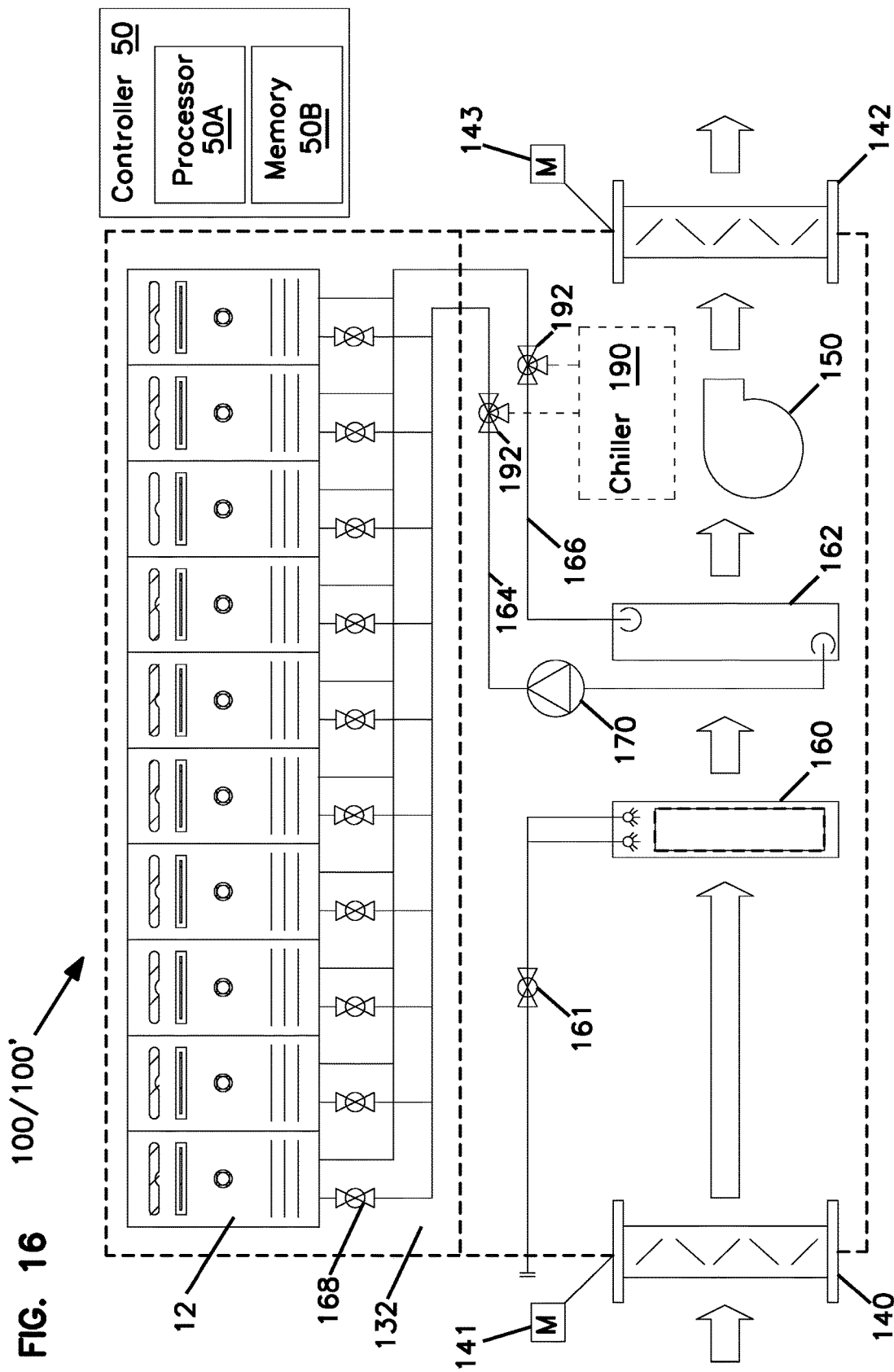
FIG. 16 is a process and instrumentation diagram showing equipment and control components of the modular data centers shown in FIGS. 1 and 9.

Referring to FIG. 16, a schematic of the cooling system for the modular data center 100/100' is shown. The schematic at FIG. 16 additionally shows the cooling circuit being connected to a refrigerated cooling circuit via valves 192. This represents an optional configuration in which mechanical cooling, for example from a chiller 190, can be provided to the equipment 12 if ambient conditions are unable to meet the cooling demand of the equipment.

Figure 17:
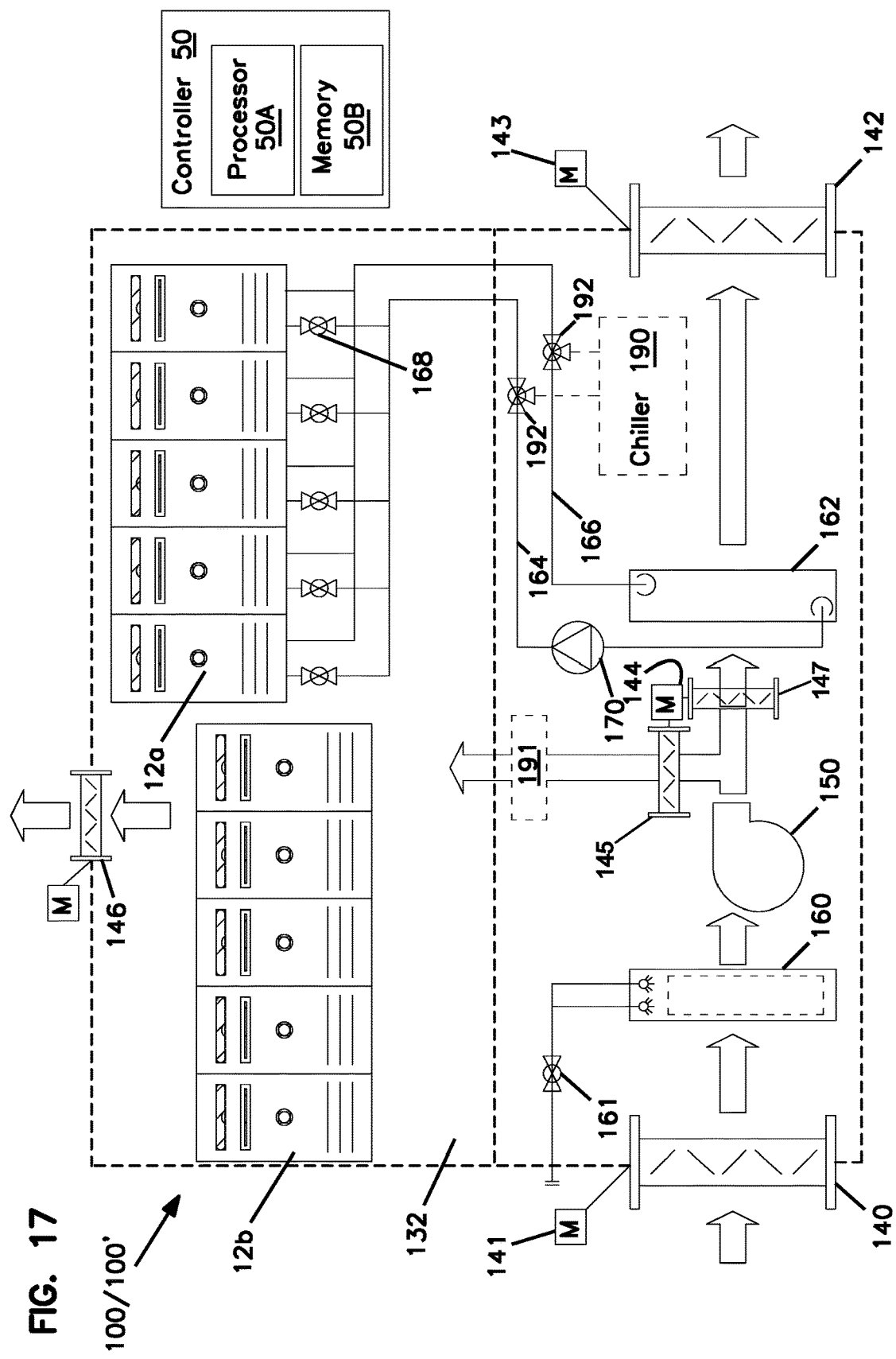
FIG. 17 is a process and instrumentation diagram showing equipment and control components of the modular data centers shown in FIGS. 1 and 9 adapted to cool both air and liquid cooled electronics equipment.

With either of the disclosed data centers 100/100', an additional cooling source can be provided for any air cooled equipment 12b located within the data modules 136. In one example, a separate mechanical refrigeration unit (e.g. direct expansion refrigeration unit, split-cooling system, etc.) is provided that directs refrigerated air into the second interior space 132. Each data module 136 can be provided with such a unit or a single unit can serve multiple modules. In one example, and as illustrated at FIG. 17, cooling of air cooled equipment 12b can be accomplished by directing some of the air leaving the evaporative cooler 160 to the second interior space 132 instead of being directed to the dry cooler 162 to provide cooling for the second interior space 132. If additional cooling is desired, a cooling coil 191 can be provided in the airflow stream delivered to the space 132. As stated above, the cooling coil can be connected to a mechanical refrigeration unit. For example, the coil 191 could be connected to the chiller 190. In one example, the air cooled equipment 12b can be portioned into a different space from the liquid cooled equipment 12a such that the cooling air from the evaporative cooler 160 is more specifically directed to the air cooled equipment 12b. However, in instances where air cooled and liquid cooled equipment 12b, 12a are combined within a single space, the cooling air can simply be delivered to the entire space. As shown, a pair of oppositely operating actuated dampers 145, 147 operated by a single actuator 144 can also be provided to control the proportion of air delivered to the space 132 and the heat exchanger 162, and to control the exhaust air leaving the space 132. Multiple actuators 144 may also be provided.

In one aspect, the modular data center 100/100' may include an electronic controller 50. The electronic controller 50 is schematically shown as including a processor 50A and a non-transient storage medium or memory 50B, such as RAM, flash drive or a hard drive. Memory 50B is for storing executable code, the operating parameters, and the input from the operator user interface 52 while processor 50A is for executing the code.

The electronic controller 50 typically includes at least some form of memory 50B. Examples of memory 50B include computer readable media. Computer readable media includes any available media that can be accessed by the processor 50A. By way of example, computer readable media include computer readable storage media and computer readable communication media.

Computer readable storage media includes volatile and nonvolatile, removable and non-removable media implemented in any device configured to store information such as computer readable instructions, data structures, program modules or other data. Computer readable storage media includes, but is not limited to, random access memory, read only memory, electrically erasable programmable read only memory, flash memory or other memory technology, compact disc read only memory, digital versatile disks or other optical storage, magnetic cassettes, magnetic tape, magnetic disk storage or other magnetic storage devices, or any other medium that can be used to store the desired information and that can be accessed by the processor 50A.

Computer readable communication media typically embodies computer readable instructions, data structures, program modules or other data in a modulated data signal such as a carrier wave or other transport mechanism and includes any information delivery media. The term "modulated data signal" refers to a signal that has one or more of its characteristics set or changed in such a manner as to encode information in the signal. By way of example, computer readable communication media includes wired media such as a wired network or direct-wired connection, and wireless media such as acoustic, radio frequency, infrared, and other wireless media. Combinations of any of the above are also included within the scope of computer readable media.

Electronic controller 50 is also shown as having a number of inputs and outputs that may be used for implementing the operation of the modular data center cooling system. For example, the system can include outputs to control the activation and speed of the fans 152 and pump 170 and to control the position of the valves 161, 161. Additional outputs can be provided to damper actuators 141, 143 respectively associated with the air inlets and outlets 140, 142 and for the actuator 144 for the damper assemblies 145, 147. The position of the control valves 161, 168, and 192 can also be commanded from the electronic controller, as can the activation of the chiller 190, if provided. Numerous inputs can also be provided to the controller 50 to enable the above noted output control. For example, entering and leaving water temperatures to the dry cooler, air flow rate and/or pressure, entering and leaving air temperature and humidity, electronics equipment temperature, entering and leaving water temperatures from the electronics equipment branches, temperature for water entering evaporative cooler, leaving air temperature and humidity from evaporative cooler, leaving temperature from the dry cooler, fan and pump status, and inputs from the electronics/server equipment such as internal temperature. Many other inputs and outputs may be provided.

In one example, the electronic controller 50 includes an input from an ambient air temperature sensor and receives the value as "Tair" and includes an input from a liquid temperature sensor associated with line 164 and/or line 166 and receives the value as "Tserver." The ambient air can be 100% saturated by the evaporative cooler 160 to take full advantage of the latent heat of evaporation, wherein the controller 50 includes inputs from air temperature and humidity sensors for the air leaving the evaporative cooler 160 and receives the values as "Tair'" and "Hair'."

In a first operational state, where Tair'<T server−X degrees (based on ambient conditions for humidity and evaporative cooler performance): the inlet and exhaust dampers 140, 142 are commanded open via actuators 141, 143; the water flow to the evaporative cooler 160 is cycled or modulated to meet a leaving humidity level setpoint relating to Hair'; and the fans 150 are commanded on and their speed is modulated to meet a temperature setpoint relating to Tserver. The pump 170 is also commanded on and the flow to the servers is modulated by controlling the speed of the pump 170 and/or by the position of a flow control valve(s) to maintain a temperature differential setpoint across the supply and return lines 164, 166.

In a second operational state, where Tair'>T server−X degrees (based on ambient conditions for humidity and evaporative cooler performance): the inlet and exhaust dampers 140, 142 are commanded closed via actuators 141, 143; the water flow to the evaporative cooler 160 is shut off; the fans 150 are commanded off; and the chiller or refrigeration loop 190, which may include its own circulation pump or may utilize pump 170, is activated to meet a temperature setpoint relating to Tserver or may be actuated to maintain a temperature differential setpoint across the supply and return lines 164, 166.

In both operational states, coolant flow to the servers can be controlled via actuated valve to maintain a temperature differential across the servers (i.e. temperatures at lines 164/166). The control of the chiller / refrigeration loop can also be based on a fixed server coolant temperature setpoint. Fan speed and the evaporative cooler output can also be set based on a fixed server coolant temperature.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the disclosure.

What is claimed is:

1. An outdoor modular data center comprising: a. An outdoor air intake module defining an exterior wall including an outdoor air inlet; b. an exhaust air outlet module defining an exterior wall including an exhaust air outlet; c. one or more data modules housing liquid cooled electronics equipment, the one or more data modules being located between the air intake and outlet modules, each of the one or more data modules defining an exterior wall; d. a cooling module located between the air outlet module and the one or more data modules, the cooling module including: i. an air-to-liquid heat exchanger having an air side and a liquid side; ii. an evaporative cooler located upstream of the air-to-liquid heat exchanger, the evaporative cooler utilizing a water source to cool and humidify air travelling across the evaporative cooler and entering the air side of the heat exchanger; iii. a cooling circuit including a supply line and a return line connecting the liquid side of the heat exchanger to the liquid cooled electronics equipment, the cooling circuit including a pump that, when activated, circulates a refrigerant between the first heat exchanger liquid side and the liquid cooled electronics equipment via the supply and return lines. e. a fan module located between the cooling module and the exhaust air outlet module, the fan module including at least one fan that, when activated, draws air outdoor air into the outdoor air inlet, through the evaporative cooler and the air side of the heat exchanger, and out of the exhaust air outlet; f. wherein, when the modules are assembled together, the modules define an exterior enclosure housing a first interior space within which the liquid cooled communication equipment is housed and a second interior space through which air can flow from the inlet, through a portion of the data module, through the fan and cooling modules, and out of the exhaust air outlet module, wherein during operation of the fan and the pump, the refrigerant is cooled during circulation through the heat exchanger and the air is heated when passing through the heat exchanger.

2. The outdoor modular data center of claim 1, wherein the cooling circuit includes one or more control valves in the supply or return line to control refrigerant flow to individual or grouped units of the liquid cooled electronics equipment.

3. The outdoor modular data center of claim 2, further comprising: a. an electronic control system that controls operation of the fan, the pump, and the one or more control valves.

4. The outdoor modular data center of claim 3, wherein the control systems controls the speed of at least one of the fan and the pump to maintain a liquid temperature setpoint in the return line of the cooling circuit.

5. The outdoor modular data center of claim 1, wherein the control system controls the speed of the pump to maintain a pressure setpoint in the supply line of the cooling circuit at a location between the one or more control valves and the pump.

* * * * *

UNITED STATES PATENT AND TRADEMARK OFFICE
CERTIFICATE OF CORRECTION

| | | |
|---|---|---|
| PATENT NO. | : 10,492,341 B2 | Page 1 of 1 |
| APPLICATION NO. | : 15/642937 | |
| DATED | : November 26, 2019 | |
| INVENTOR(S) | : Thomas F. Craft, Jr. | |

It is certified that error appears in the above-identified patent and that said Letters Patent is hereby corrected as shown below:

In the Claims

Column 8, Line 42, Claim 5: "claim 1, wherein" should read --claim 3, wherein--

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*